United States Patent [19]

Nagano

[11] Patent Number: 4,806,873
[45] Date of Patent: Feb. 21, 1989

[54] LASER DIODE DRIVING CIRCUIT

[75] Inventor: Katsumi Nagano, Setagaya, Japan

[73] Assignee: Kabushiki Kaisha Toshiba, Kawasaki, Japan

[21] Appl. No.: 183,495

[22] Filed: Apr. 14, 1988

Related U.S. Application Data

[63] Continuation of Ser. No. 932,208, Nov. 18, 1986, abandoned.

[30] Foreign Application Priority Data

Nov. 19, 1985 [JP] Japan .................................. 60-257634
Nov. 19, 1985 [JP] Japan .................................. 60-257635

[51] Int. Cl.[4] .............................................. H04B 9/00
[52] U.S. Cl. ........................................ 330/4.3; 372/31; 372/38
[58] Field of Search .................. 372/31, 33, 38, 81; 455/613; 330/4.3; 250/205

[56] References Cited

U.S. PATENT DOCUMENTS

| 3,898,583 | 8/1975 | Shuey ............................. | 372/33 X |
|---|---|---|---|
| 3,946,335 | 3/1976 | De Loach, Jr. et al. .......... | 372/31 X |
| 3,996,526 | 12/1976 | d'Auria et al. ..................... | 372/31 |
| 4,339,822 | 7/1982 | Kolodzey . | |
| 4,344,173 | 8/1982 | Straus ............................... | 372/38 |
| 4,369,525 | 1/1983 | Breton et al. ..................... | 372/31 X |
| 4,484,331 | 11/1984 | Miller . | |
| 4,577,320 | 3/1986 | Yoshikawa et al. .............. | 372/38 X |
| 4,592,057 | 5/1986 | Comerford ........................ | 372/31 X |
| 4,611,352 | 9/1986 | Fujito et al. ...................... | 372/31 X |
| 4,612,671 | 9/1986 | Giles ................................. | 372/38 X |
| 4,621,376 | 11/1986 | Nakamura et al. ............... | 372/38 X |

OTHER PUBLICATIONS

Bobrow, Leonard S., "Elementary Circuit Analysis", 1981, CBS College Publishing, p. 163.

Primary Examiner—Thomas H. Tarcza
Assistant Examiner—Mark Hellner
Attorney, Agent, or Firm—Cushman, Darby & Cushman

[57] ABSTRACT

A laser diode circuit has a photodiode which monitors the light output which is outputted by the laser diode and generates a photovoltaic current that corresponds to the level of the light output, a reference current selection device which selects a required reference current by switching among a plurality of reference current sources that are set to values of mutually different current values, and an amplifying apparatus which, by receiving a signal that corresponds to the photovoltaic current, controls the forward current of the laser diode so as to bring the photovoltaic current to a selected reference current. Instead of the above construction, there may be employed a construction which has a voltage transforming selector which generates a photovoltaic current signal voltage that corresponds to the photovoltaic current, a reference voltage selection device which selects a required reference voltage by switching among a plurality of reference voltage sources that are set to values of mutually different reference voltages, and an amplifying apparatus which, by receiving the photovoltaic current signal voltage and a selected reference voltage, controls the forward current of the laser diode so as to bring the photovoltaic current signal voltage equal to the selected reference voltage.

27 Claims, 12 Drawing Sheets

LASER DIODE DRIVING CIRCUIT

This is a continuation of application Ser. No. 932,208, filed Nov. 18, 1986, which is as abandoned upon the filing hereof.

BACKGROUND OF THE INVENTION

1. Field of the Invention

The present invention relates to a laser diode driving circuit which is used as a light source, for instance, for an optical disc device, whereby the light output of the laser diode can be controlled stably for each of a plurality of output levels by means of a reference current selection system.

2. Description of the Prior Art

As a laser diode driving circuit for controlling the light output of a laser diode to a constant output level, there has been known type which makes use of an operational amplifier as shown in FIG. 1. The laser diode driving circuit is a circuit which is disclosed through publication in catalogs of laser diodes or the like.

In FIG. 1, LD is a laser diode, PD is a photodiode for monitoring the light output of the laser diode, and use is made of an arrangement in which the laser diode LD and the photodiode PD are built in a single package. In the package, one of the output surfaces of the laser diode LD is oriented facing the photodiode PD, and the light output $P_o$ is taken out to the outside from the other output surface.

The reference symbol $A_1$ is an operational amplifier for controlling the forward current of the laser diode LD, and there is arranged an input signal setting circuit as will be described below.

Namely, between a line $1a$ for a positive power supply which provides a supply voltage $V_{cc}$, and a line $1b$ for a negative power supply, there are connected in parallel a reference voltage setting circuit 2 which has two resistors $R_1$ and $R_2$ connected in series, and a photovoltaic current signal line which has a resistor $R_3$ connected to a current line 3 for photovoltaic current $I_S$.

The setting point $2a$ of the reference voltage $V_{ref}$ in the reference voltage setting circuit 2 is connected to the inverting input terminal $4a$ of the operational amplifier $A_1$, and the output point $3a$ of the photovoltaic current signal in the photovoltaic current signal line is connected to the noninverting input terminal $4b$.

The value of the reference voltage $V_{ref}$ that is set in the reference voltage setting circuit 2 is given by $$V_{ref} = V_{cc} \cdot R_2/(R_1 + R_2). \qquad (1)$$

The operational amplifier $A_1$ controls the forward current $I_f$ of the laser diode LD so as to bring the voltage difference to zero between the reference voltage $V_{ref}$ that is input to the inverting input terminal $4a$ and the voltage $I_s.R_3$ of the photovoltaic current signal that is input to the noninverting input terminal $4b$. Between the power supply line $1a$ and the output terminal $4c$ of the operational amplifier $A_1$, there is connected a forward current circuit 5 of the laser diode LD. Further, $R_4$ in the figure is a current restricting resistor.

When the current $I_f$ that flows in the laser diode LD reaches a predetermined "threshold current," the laser diode LD begins to oscillate to generate a light output $P_o$. Upon receipt of the light output $P_o$ the photodiode PD generates a photovoltaic current $I_s$ which is proportional to the light output, and the voltage $I_s.R_3$ of the photovoltaic current signal is input to the noninverting input terminal $4b$.

The operational amplifier $A_1$ controls the forward current $I_f$ of the laser diode LD so as to bring to zero the difference between the two voltages that are input to both of the inverting and noninverting input terminals $4a$ and $4b$ by the feedback action of the light output $P_o$ from the laser diode LD to the photodiode PD.

When the difference between both input voltages to the input terminals $4a$ and $4b$ is controlled to be zero, the relation $I_s.R_3 = V_{ref}$ becomes valid, so that the output level of the light output $P_o$ of the laser diode is controlled in the sense that the value of the photovoltaic current $I_s$ is determined as $$I_s = V_{ref}/R_3 = V_{cc} \cdot R_2/[(R_1 + R_2) \cdot R_3]. \qquad (2)$$

Now, when the laser diode is used as the light source, for example, for an optical disc device, it is necessary to control its light output stably for a plurality of output levels corresponding to the write level, the read level, and others.

However, in the above driving circuit for the laser diode, resistor $R_3$ is connected to the current line 3 of the photovoltaic current $I_s$ and the light output $P_o$ of the laser diode LD is controlled to a constant output level at the point where the value of the photovoltaic current $I_s$ has the value $I_s = V_{ref}/R_3$ that is given by Eq. (2). Consequently, it is not possible to control the light output stably at each of the plurality of output levels, so that it has a problem in that it cannot be used as a light source for an optical disc device and the like.

Further, in the above driving circuit of the laser diode, the reference voltage $V_{ref}$ is set to be voltage-divided by the reference voltage setting circuit 2 in which two resistors $R_1$ and $R_2$ are connected in series, and the light output $P_o$ of the laser diode LD is controlled to a constant output level at the point where the value of the photovoltaic current $I_s$ becomes $I_s = V_{ref}/R_3$ as shown in Eq. (2). Therefore, the light output cannot be controlled stably for each of the plurality of the output levels so that there was a problem in that the system could not be used as a light source for an optical disc device.

SUMMARY OF THE INVENTION

With the above problems in mind, an object of the present invention is to provide a driving circuit for the laser diode which is capable of stably controlling each of a plurality of required output levels of the light output of the laser diode.

In order to achieve the above object, the present invention has reference current selection means, that can switch and select the reference current at a required value, connected to the current line of the photovoltaic current that is generated in the photodiode. Further, the light output of the laser diode is arranged to be controlled stably to a plurality of output levels that correspond to a plurality of photovoltaic current levels, by regulating the feedback loop between the laser diode and the photodiode with an operational amplifier so as to set the photovoltaic current of the photodiode equal to a selected reference current.

Further, the present invention provides a voltage selection means which can switch and select the reference voltage at a required value, and is designed to control stably the light output of the laser diode to a plurality of output levels that correspond to a plurality of photovoltaic current levels, by regulating with an operational amplifier the feedback loop between the laser diode and the photodiode so as to set the voltage of the photovoltaic current signal that corresponds to the photovoltaic current of the photodiode equal to a selected reference voltage.

BRIEF DESCRIPTION OF THE DRAWINGS

These and other objects, features and advantages of the present invention will be more apparent from the following description of a preferred embodiment taken in conjunction with the accompanying drawings in which.

DESCRIPTION OF THE PREFERRED EMBODIMENTS

Figure 2:
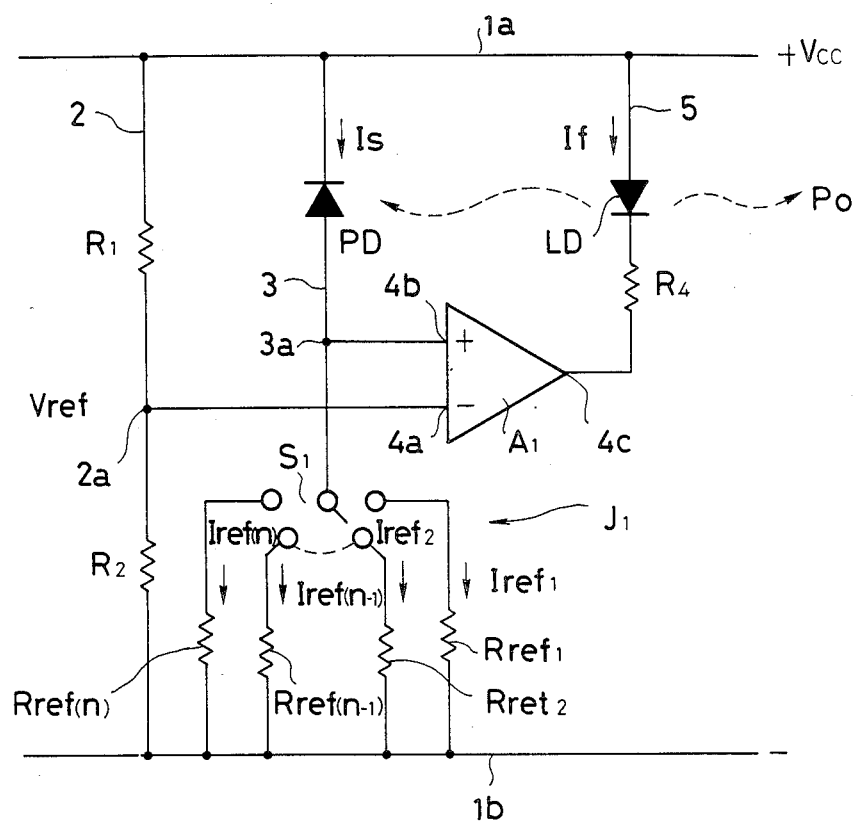
FIG. 2 is a circuit diagram which shows a first embodiment of the driving circuit for the laser diode in accordance with the present invention.
Figure 3:
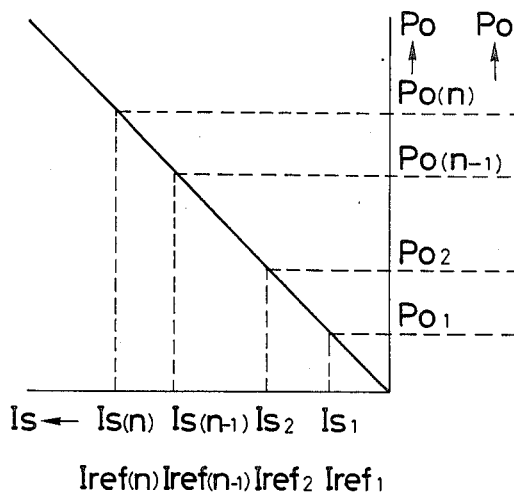
FIG. 3 illustrates characteristic diagrams which show the relationship between the forward current of the laser diode used in the first embodiment and the light output, and the relationship between the light output and the photovoltaic current of the photodiode.
Figure 3:
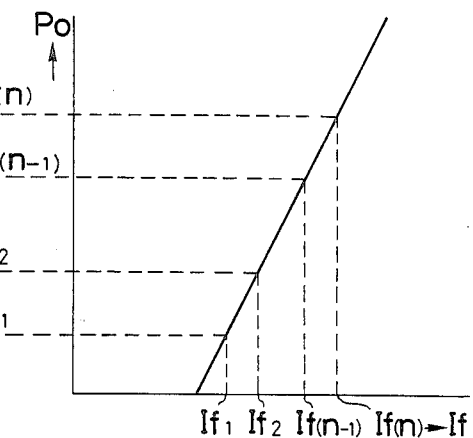

Referring to FIG. 2 and FIG. 3, a first embodiment of the present invention will be described.

Figure 1:
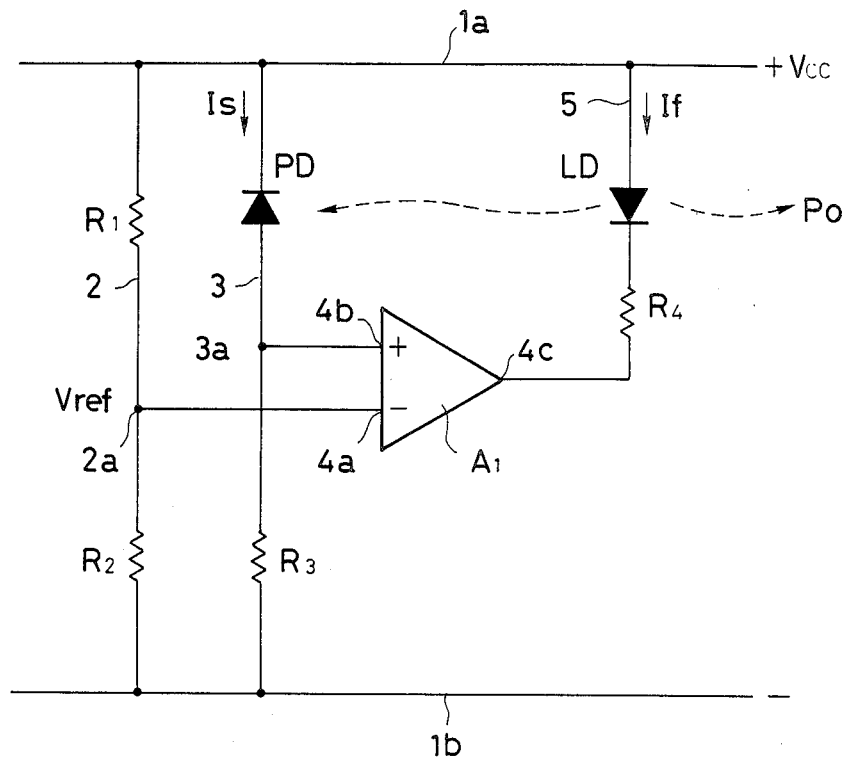
FIG. 1 is a circuit diagram of a driving circuit for a prior-art laser diode.

In FIG. 2 and figures that show each embodiment that will be described laser, circuit elements, apparatus, and others that are identical or equivalent to those shown in FIG. 1 are given identical symbols to omit repeated explanation.

To illustrate the construction, in this embodiment, a reference current selection means $J_1$ that will be described below is connected to a current line 3 for the photovoltaic current $I_s$.

Namely, the reference current selection means $J_1$ consists of a rotary switch $S_1$ with n contacts in one circuit and n reference resistors $R_{ref1}$ to $R_{ref(n)}$, the common contact of the rotary switch $S_1$ being connected to the current line 3 of the photovoltaic current $I_s$ and n reference resistors $R_{ref1}$ to $R_{ref(n)}$ being connected to the power supply line 1b and each of the n contacts. The rotary switch $S_1$ comprises a multipolar switch.

When the feedback loop between the laser diode and the photodiode is controlled to an equilibrium state by an operational amplifier $A_1$, there appears a reference voltage $V_{ref}$ due to the principle of a virtual short at the noninverting input terminal 4b of the operational amplifier $A_1$, that is, the common contact of the rotary switch $S_1$. Accordingly, the reference resistors $R_{ref1}$ to $R_{ref(n)}$ function equivalently to the sources of a plurality of reference currents $I_{ref1}$ to $I_{ref(n)}$ under the cooperation with the voltage $V_{ref}$.

Next, referring to FIGS. 3(A) and 3(B), the operation of the driving circuit will be described.

FIG. 3(A) is a characteristic diagram which shows the relationship between the forward current $I_f$ of the laser diode LD and the light output $P_o$. FIG. 3(B) is a characteristic diagram which shows the relationship between the light output $P_o$ of the laser diode LD and the photovoltaic current $I_s$ which is generated in the photodiode PD.

Now, suppose that the rotary switch $S_1$ is switched to the reference resistor $R_{ref2}$ as shown in FIG. 2, and the reference current selection means $J_1$ is selected to the reference current $I_{ref2}$.

As may be seen from FIG. 3(A), the laser starts to oscillate when the forward current $I_f$ of the laser diode reaches a certain "threshold current value," and thereafter there is obtained a light output which is proportional to the forward curent $I_f$. Upon receipt of the light output $P_o$, the photodiode PD generates a photovoltaic current $I_s$ which is proportional to the light output, and there is input a voltage $I_s \cdot R_{ref2}$ of the photovoltaic current signal at the noninverting input terminal 4b of the operational amplifier $A_1$.

To the inverting input terminal 4a of the operational amplifier $A_1$ there is input a voltage $V_{ref} = I_{ref2} \cdot R_{ref2}$. Therefore, the operational amplifier $A_1$ controls the feedback loop between the laser diode LD and the photodiode PD so as to set to zero the difference between the two input voltage $I_s \cdot R_{ref2}$ and $I_{ref2} \cdot R_{ref2}$, in other words, it controls the forward current $I_f$ of the laser diode so as to have the generated photovoltaic current $I_s$ to be equal to the selected reference current $I_{ref2}$.

At the point in time when the feedback loop is balanced, the photovoltaic current $I_{s2}$ becomes $I_{s2} = I_{ref2}$ and the forward current is controlled to a value $I_{f2}$ which corresponds to the photovoltaic current $I_{s2}$. Then, the light output $P_{o2}$ of the laser diode LD is controlled stably to a constant output level $P_{o2}$ which corresponds to the forward currnet $I_{f2}$.

When a k th reference current is selected by an operation of the rotary switch $S_1$, by a control operation of the operational amplifier $A_1$ similar to the above, the forward current of the laser diode LD is controlled to $I_{f(K)}$, and the light output is stably controlled to an output level $P_{o(k)}$ that corresponds to the forward current.

In the above manner, the light output of the laser diode LD can be controlled stably and arbitrarily to each one of the output levels.

Figure 4:
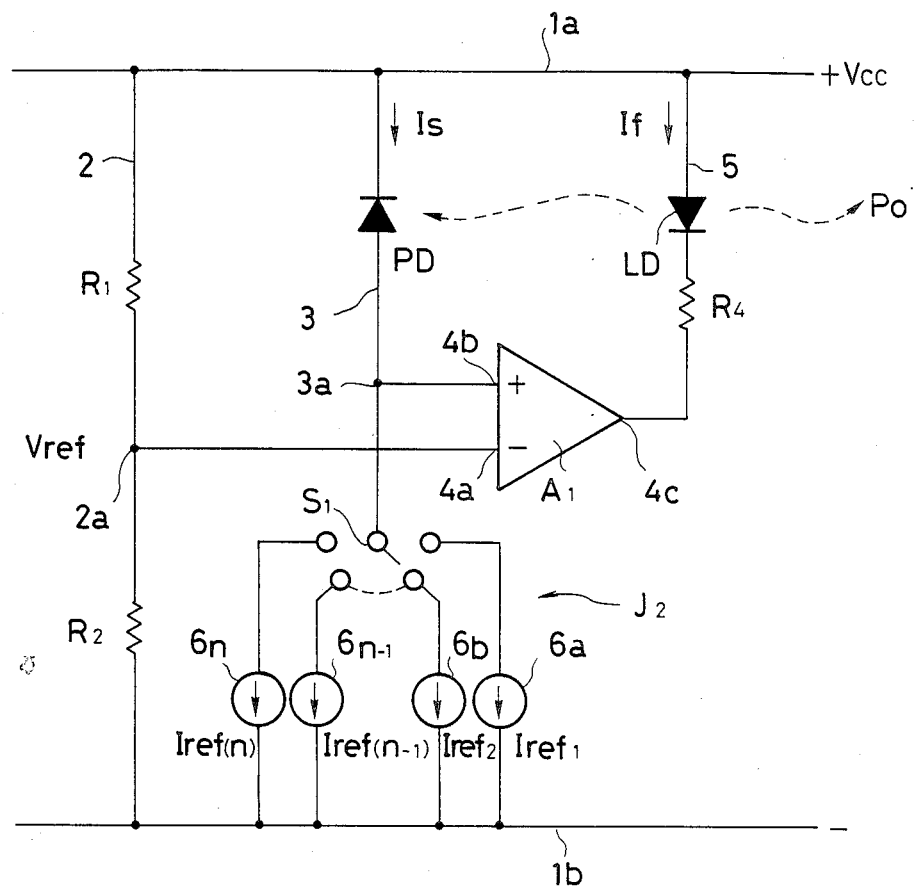
FIG. 4 is a circuit diagram which shows a second embodiment of the present invention.

In FIG. 4 is shown a second embodiment of the present invention. In the embodiment, there are provided, in parallel, n reference current sources 6a to 6n in reference current selection means $J_2$.

The values of the reference current in the reference current sources 6a to 6n are $I_{ref1}$ to $I_{ref(n)}$, respectively, where the reference current value $I_{ref(k)}$ is related to the reference resistance $R_{ref(k)}$ of the first embodiment through the equation $I_{ref(k)} = V_{ref}/R_{ref(k)}$.

Accordingly, the reference current selection means $J_2$ of the present embodiment is equivalent to the reference current selection means $J_1$ of the first embodiment. The operational amplifier $A_1$ receives the difference current $I_s - I_{ref(k)}$ between the photovoltaic current $I_s$ and the selected reference current $I_{ref(k)}$, and the operational amplifier $A_1$ controls the forward current $I_f$ of the laser diode LD to bring the differences to vanish, that is, to bring the photovoltaic current $I_s$ to be equal to the selected reference current $I_{ref(k)}$. Then, the light output is controlled stably to an output level $P_{o(k)}$ which corresponds to that situation.

Figure 5:
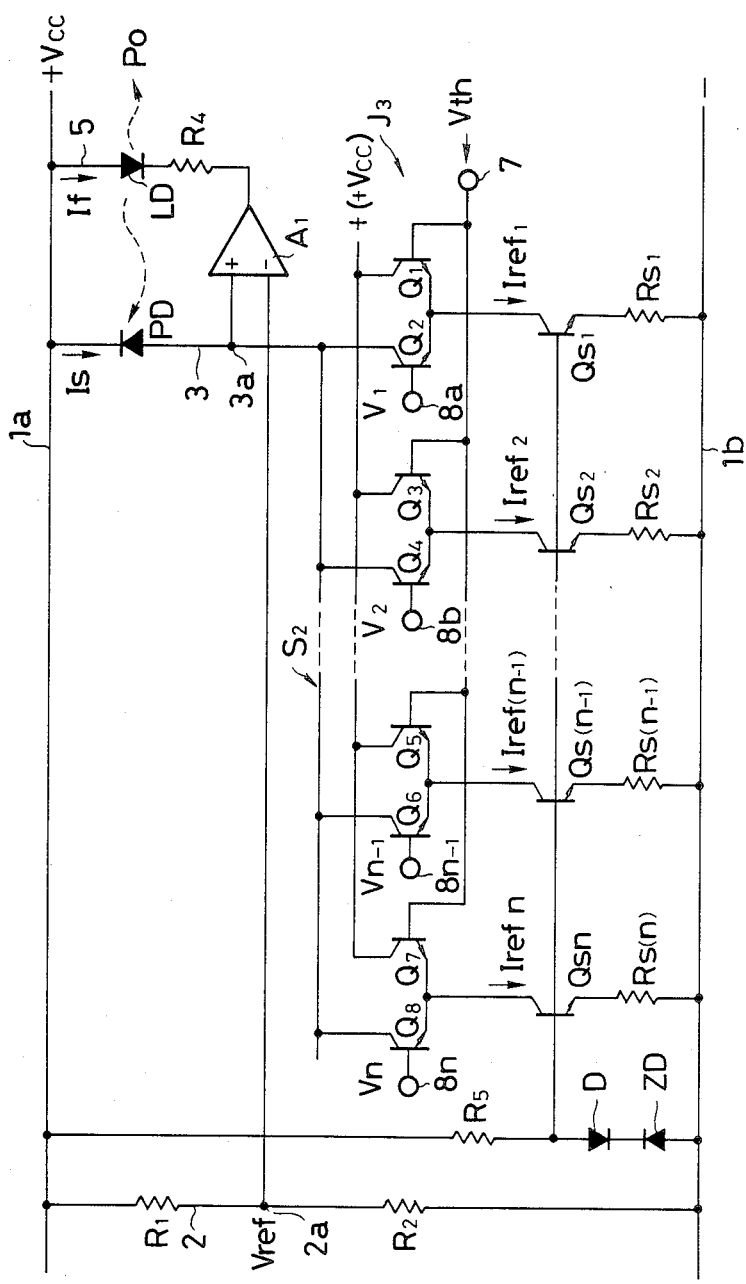
FIG. 5 is a circuit diagram which shows a third embodiment of the present invention.

In FIG. 5 is shown a third embodiment of the present invention. In the embodiment, reference current selection means $J_3$ is constructed with a switching circuit that employs n sets of differential pairs $(Q_1, Q_2)$, $(Q_3, Q_4)$, ..., and so on, n transistors $Q_{s1}$ to $Q_{sn}$, n resistors $R_{s1}$ to $R_{s(n)}$, and n reference current sources that use a diode D and a Zener diode ZD.

Reference numeral 7 is the input terminal for the "threshold voltage" $V_{th}$ of the logic circuit for the reference current selection, and 8a to 8n are input terminals for the control input voltages $V_1$ to $V_n$.

The transistors $Q_{s1}$ to $Q_{sn}$ that constitute the respective reference current sources are chosen from among those whose voltage between the base and the emitter is equal to the forward voltage of the diode D. Accordingly, each of the reference current $I_{ref(k)}$ if prescribed, with the Zener voltage of the Zener diode ZD called $V_z$, by the following equation.

$$I_{ref(k)} = V_z/R_{s(k)}. \quad (3)$$

To describe the operation of the switching circuit $S_2$, when a control voltage $V_1$ which satisfies $V_1 > V_{th}$ is given to the control voltage input terminal 8a in the differential pair $Q_1$ and $Q_2$, the transistor $Q_2$ is turned on, and the reference current $I_{ref1}$ is selected.

Similarly, only the differential pair that are given control voltage $V_k$ which is greater than the "threshold voltage" $V_{th}$ is conducted, and the reference current $I_{ref(k)}$ that corresponds to that is selected.

The operation of the driving circuit is substantially similar to the first embodiment.

Figure 6:
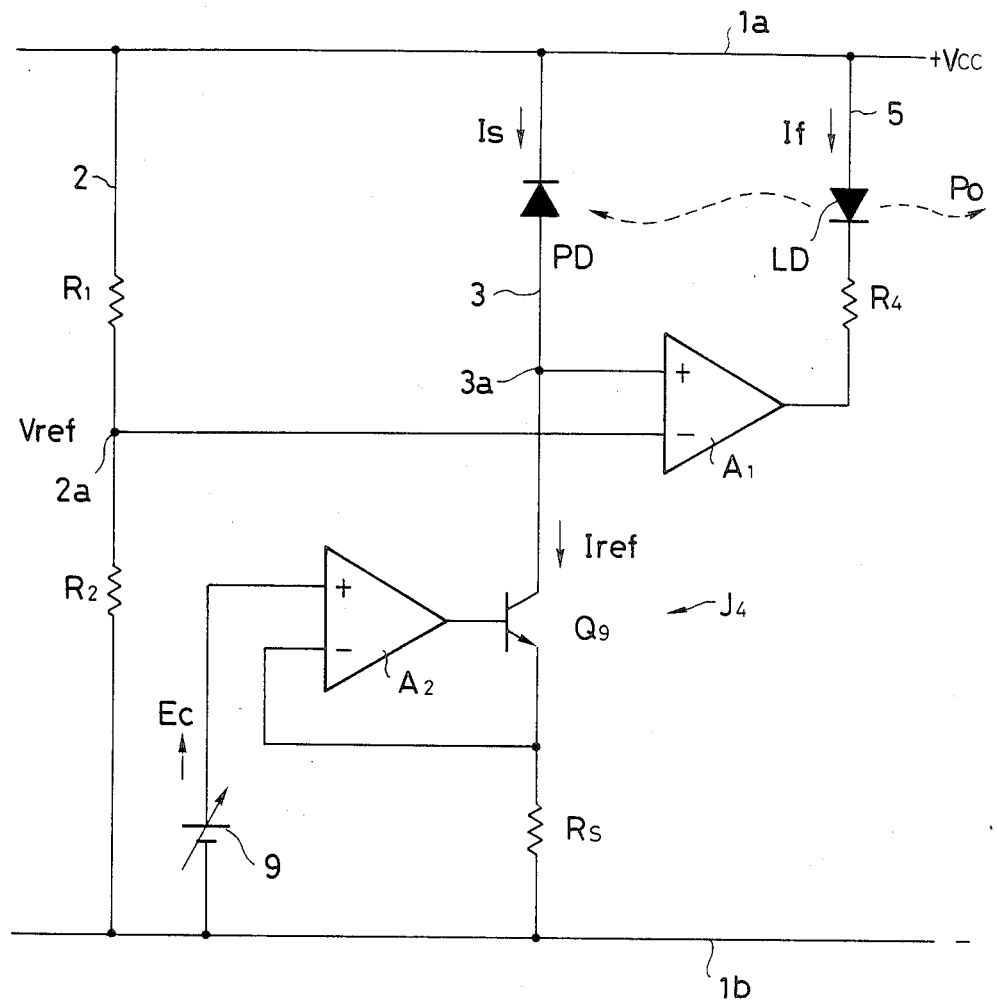
FIG. 6 is a circuit diagram which shows a fourth embodiment of the present invention.

In FIG. 6, a fourth embodiment of the present invention is shown. In the embodiment, reference current selection means $J_4$ is constructed with a voltage current conversion circuit which uses an operational amplifier $A_2$, and the reference current $I_{ref}$ is designed to be switched and selected in analog manner.

The reference current selection means $J_4$ is constructed, in addition to the operational amplifier $A_2$, with an output transistor $Q_9$ connected as an emitter-follower, an emitter output resistor $R_s$, and a variable voltage source 9.

At the junction of the emitter of the output transistor $Q_9$ and the emitter resistor $R_s$, there is generated a voltage which is identical to the analog control voltage $E_c$ from the variable voltage source 9, from the principle of a virtual short of the operational amplifier $A_2$.

Accordingly, the current value is selected to a reference current Iref which is prescribed by $$I_{ref} = E_c/R_s. \quad (4)$$

From Eq. (4) above, the reference current $I_{ref}$ is switched and selected in analog manner in response to the voltage value of the analog control voltage $E_c$. Accordingly, the output level of the light output $P_o$ of the laser diode can be variably controlled in analog fashion.

As described in the foregoing, according to the present invention, a reference current selection means which can switch and select the reference current to a required value is connected to the current line of the photovoltaic current that is generated in the photodiode, and the forward current of the laser diode is controlled by an operational amplifier so as to bring the photovoltaic current of the photodiode to be equal to a selected reference current value. Accordingly, there is obtained an effect that the light output of the laser diode can be controlled stably to a plurality of output levels that correspond to each of a plurality of the photovoltaic current levels.

Next, referring to FIG. 7 and FIG. 8, a fifth embodiment of the present invention will be described.

First, to describe its construction, in the embodiment, there is connected the following reference voltage selection means $B_1$ to the inverting input terminal 4a of the operational amplifier A.

Namely, the reference voltage selection means $B_1$ is constructed with a voltage dividing circuit which has $(n+1)$ resistors $R_1$ to $R_{(n+1)}$ connected in series, between a positive power supply 1a and a negative power supply 1b, and a rotary switch S with n contacts in one circuit. The common contact of the rotary switch S is connected to a noninverting input terminal 4a of the operational amplifier A, and the n contacts are connected to the connecting points between each of the resistors $R_1$ to $R_{(n+1)}$.

In the reference voltage selection means $B_1$, the power supply voltage $V_{cc}$ is voltage-divided by $(n+1)$ resistors $R_1$ to $R_{(n+1)}$ to set n reference voltage $V_{ref1}$ to $V_{ref(n)}$. The reference voltage $V_{ref(k)}$ at the k-th voltage-dividing point is given by $$V_{ref(k)} = \sum_{l=1}^{k} R \cdot V_{cc}/\Sigma R, \quad (5)$$

where $\Sigma R = R_1 + R_2 + \ldots + R_{(n)} + R_{(n+1)}$.

Figure 7:
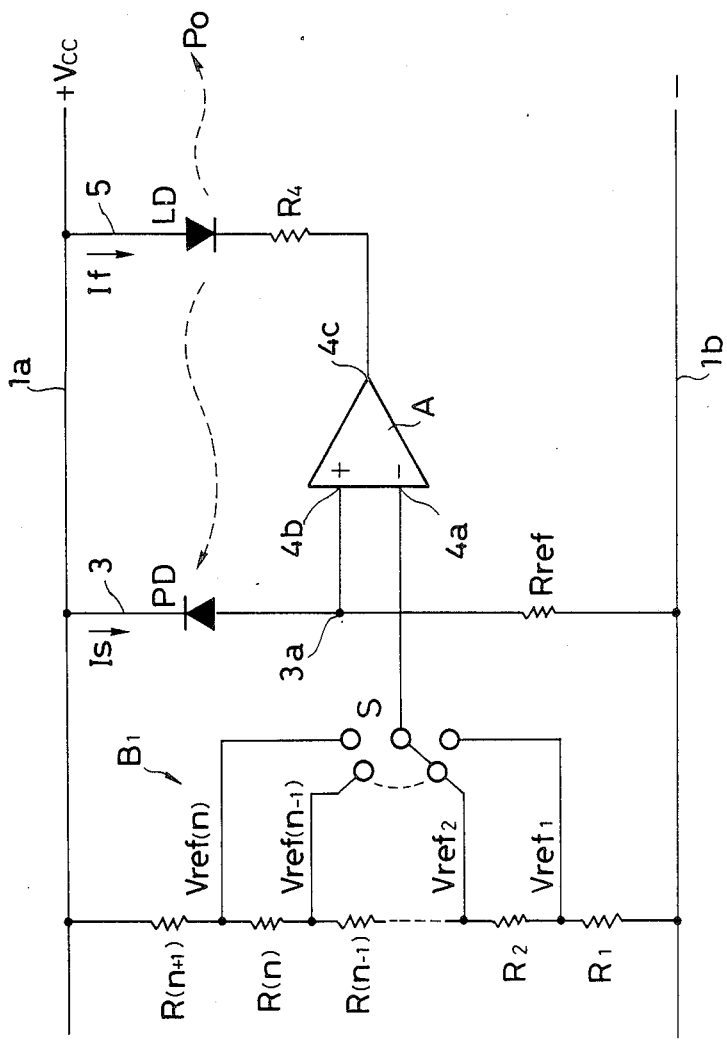
FIG. 7 is a circuit diagram which shows a fifth embodiment of the driving circuit for the laser diode in accordance with the present invention.
Figure 8:
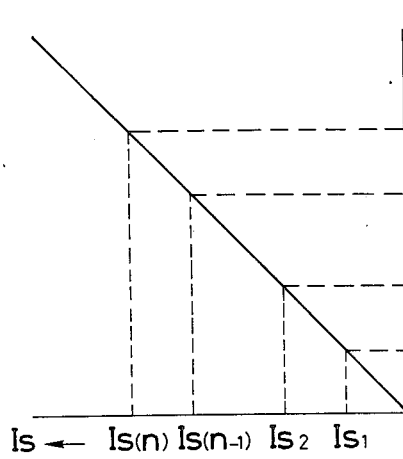
FIG. 8 illustrates characteristic diagrams which show the relationship between the forward current of the laser diode that is used in the fifth embodiment and the light output, and the relationship between the light output and the photovoltaic current of the photodiode.
Figure 8:
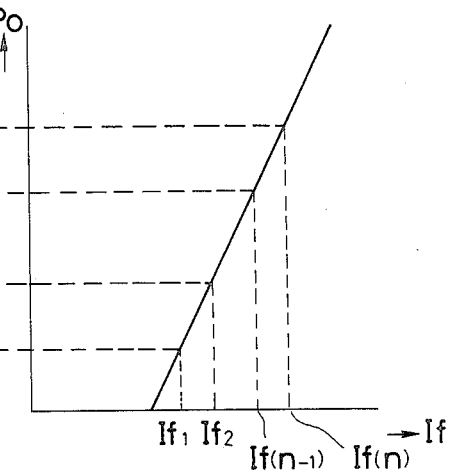

In FIG. 7, $R_{ref}$ is the voltage converting resistor.

Next, referring to FIGS. 8(A) and 8(B), the operation of the driving circuit will be described.

FIG. 8(A) is a characteristic diagram which shows the relationship between the forward current $I_f$ of the laser diode LD and the light output $P_o$, and FIG. 8(B) is a characteristic diagram which shows the relationship between the light output $P_o$ of the laser diode LD and the photovoltaic current $I_s$ generated in the photodiode PD.

Now, suppose that the rotary switch S is switches to the reference voltage $V_{ref2}$ as shown in the figure, and the reference voltage $V_{ref2}$ is selected from the reference voltage selection means $B_1$.

As shown in FIG. 8(A), the laser starts to oscillate when the forward current $I_f$ that flows in the laser diode LD reaches a certain "threshold current value," thereafter there is obtained a light output $P_o$ which is proportional to the forward current $I_f$. Upon receipt of the light output $P_o$, the photodiode PD generates a photovoltaic current $I_s$ which is proportional to the light output, and a photovoltaic current signal voltage $I_s \cdot R_{ref}$ is input to the noninverting input terminal 4b of the operational amplifier.

To the inverting input terminal 4a of the operational amplifier A, there is input the reference voltage $V_{ref2}$. Therefore, the operational amplifier A controls the feedback loop between the laser diode LD and the photodiode PD so as to bring the difference between the voltage $I_s.R_{ref}$ of the photovoltaic curent signal and the reference voltage $V_{ref2}$ to zero. In other words, the operational amplifier A controls the forward current $I_f$ of the laser diode LD so as to bring the voltage of the photovoltaic current signal, $I_s.R_{ref}$, to be equal to the selected reference voltage $V_{ref2}$.

The photovoltaic current becomes $$I_{s2} = V_{ref2}/R_{ref}$$

at the point in time when the feedback loop is balanced, and the forward current is controlled to a value $I_{f2}$ which corresponds to the photovoltaic current $I_{s2}$. Then, the light output $P_o$ of the laser diode LD is controlled stably to a constant output level $P_o$ that corresponds to the forward current $I_{f2}$.

When the reference voltage $V_{ref(k)}$ is selected by the operation of the rotary switch S, by a control operation of the operational amplifier A similar to the above, the forward current of the laser diode LD is controlled to $I_{f(k)}$, and the light output is controlled stably to an output level $P_{o(k)}$ which corresponds to the forward curent $I_{f(k)}$.

In this way, the light output of the laser diode LD can be controlled stably to an arbitrary output level.

Figure 9:
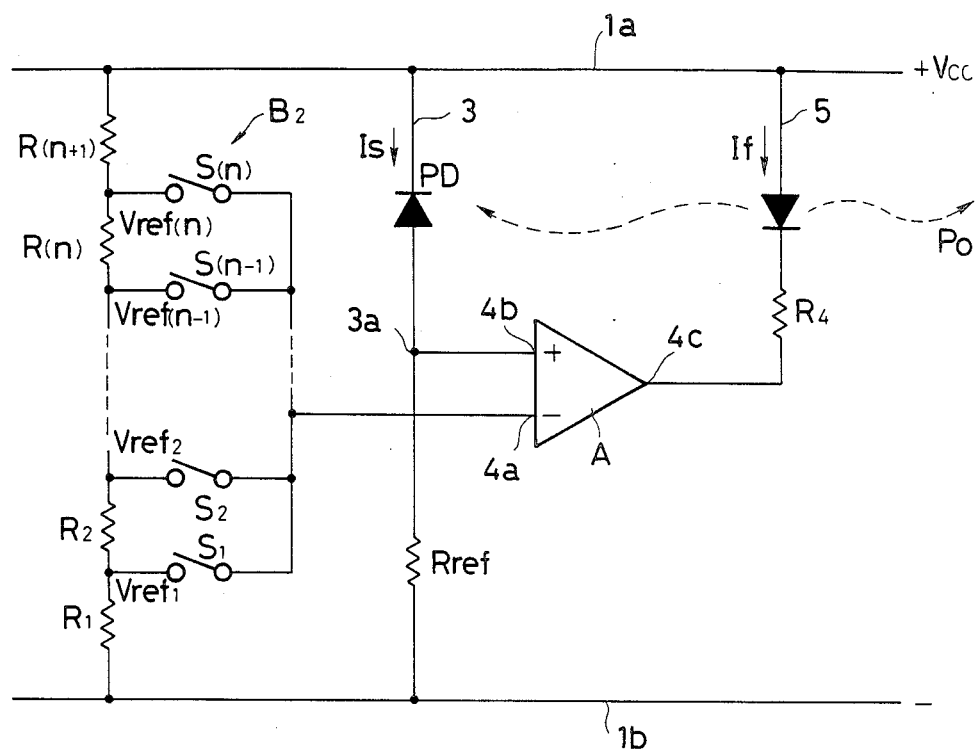
FIG. 9 is a circuit diagram which shows a sixth embodiment of the present invention.

FIG. 9 is shown a sixth embodiment of the present invention. In the present embodiment, the switching means in the reference voltage selection means $B_2$ is formed by the use of n on-off switches $S_1$ to $S_{(n)}$ constituting a multipolar switch in place of the rotary switch of the first embodiment. By selecting one out of n switches $S_1$ to $S_{(n)}$ and by turning it on, a desired reference voltage can be selected.

The operation of the driving circuit is analogous to that of the fifth embodiment.

Figure 10:
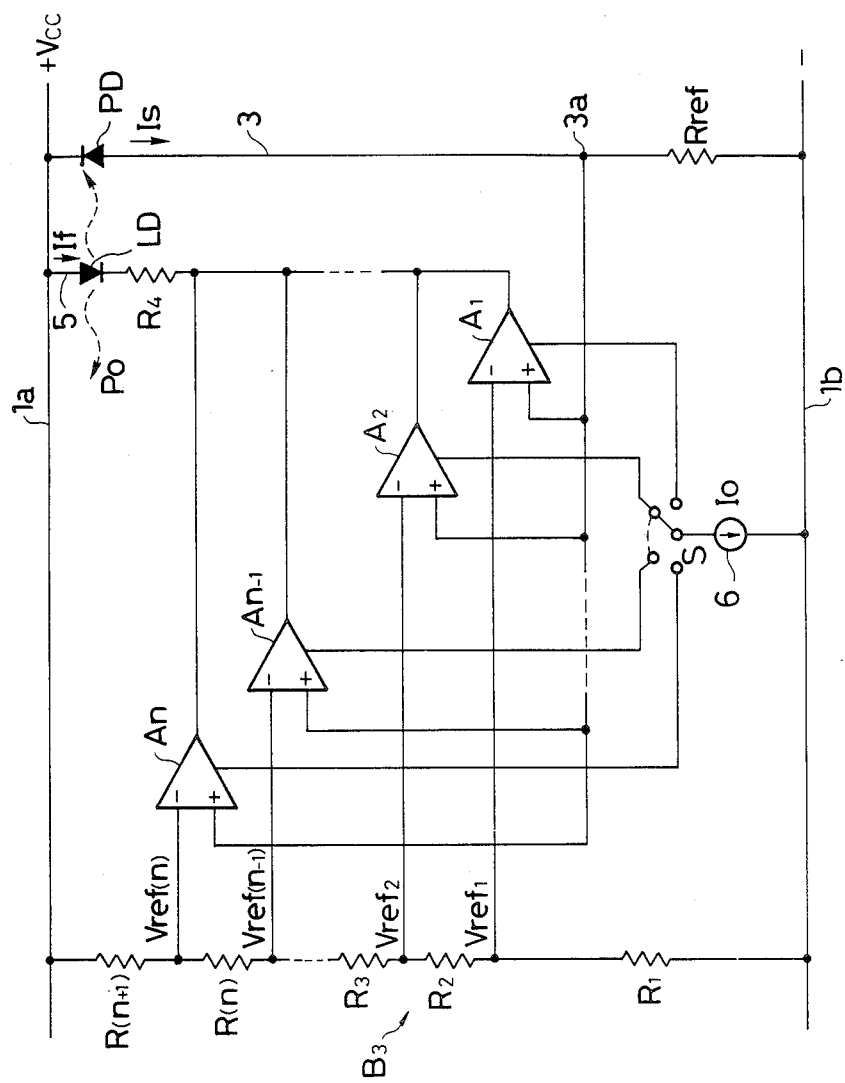
FIG. 10 is a circuit diagram which shows a seventh embodiment of the present invention.

In FIG. 10 is shown a seventh embodiment of the present invention. In the embodiment, n operational amplifiers $A_1$ to $A_n$, are used and a desired reference voltage is designed to be selected equivalently, by selecting and operating one out of the operational amplifiers $A_1$ to $A_n$.

As the reference voltage selection means $B_3$, use are made of a voltage dividing circuit similar to the one used in the fifth embodiment which is formed by serially connecting (n+1) resistors $R_1$ to $R_{(n+1)}$, and a rotary switch of n contacts for one circuit. However, the disposed position of the rotary switch S for the present embodiment differs from that of the fifth embodiment in the following respect.

Namely, a constant current source 6 which is common to the operational amplifiers $A_1$ to $A_n$ is connected between the common contact of the rotary switch S and a power supply 1b. In addition, each of the n contacts of the rotary switch S is connected respectively to the constant current terminal of the corresponding operational amplifier in $A_1$ to $A_n$.

The voltage dividing point of the reference voltage $V_{ref1}$ is connected to the inverting input terminal of the operational amplifier $A_1$, and the voltage dividing point of the reference voltage $V_{ref2}$ is connected to the inverting input terminal of the operational amplifier $A_2$. In a similar manner, the voltage dividing point of the respective reference voltages $V_{ref3}, \ldots V_{ref(n-1)}$, and $V_{ref(n)}$ is connected respectively to the inverting input terminal of each of the remaining operational amplifiers.

On the other hand, the noninverting input terminals of the operational amplifiers $A_1$ to $A_n$ are connected jointly to the output point 3a of the voltage $I_s.R_{ref}$ of the photovoltaic current signal. Further, the output terminal of each of the operational amplifiers $A_1$ to $A_n$ is connected jointly to the forward current circuit 5 of the laser diode LD.

The operation of the driving circuit will be described next.

Suppose that the rotary switch S is switched to the second operational amplifier $A_2$ as shown in the figure. Then, a constant current $I_o$ flows in the operational amplifier $A_2$, and the operational amplifier $A_2$ is selectively set to the operating condition. Since a reference voltage $V_{ref2}$ is input to the inverting input terminal of the operational amplifier $A_2$, there is selected equivalently the reference voltage $V_{ref2}$ from the reference voltage selection means $B_3$.

Thereafter, the driving circuit operates analogous to the fifth embodiment. At the time when the feedback loop between the laser diode LD and the photodiode PD is controlled as balanced, the photovoltaic current of the photodiode PD becomes $I_{s2}$ that corresponds to the reference voltage $V_{ref2}$, and the light output $P_o$ of the laser diode LD is controlled stably to a constant output level $P_{o2}$ that corresponds to the photovoltaic current $I_{s2}$.

When an operational amplifier $A_{(k)}$ is selected by operating the rotary switch S, a reference voltage $V_{ref(k)}$ is selected equivalently, and the light output $P_o$ is controlled stably to an output level $P_{o(k)}$ that corresponds to the photovoltaic current $I_{s(k)}$.

Figure 11:
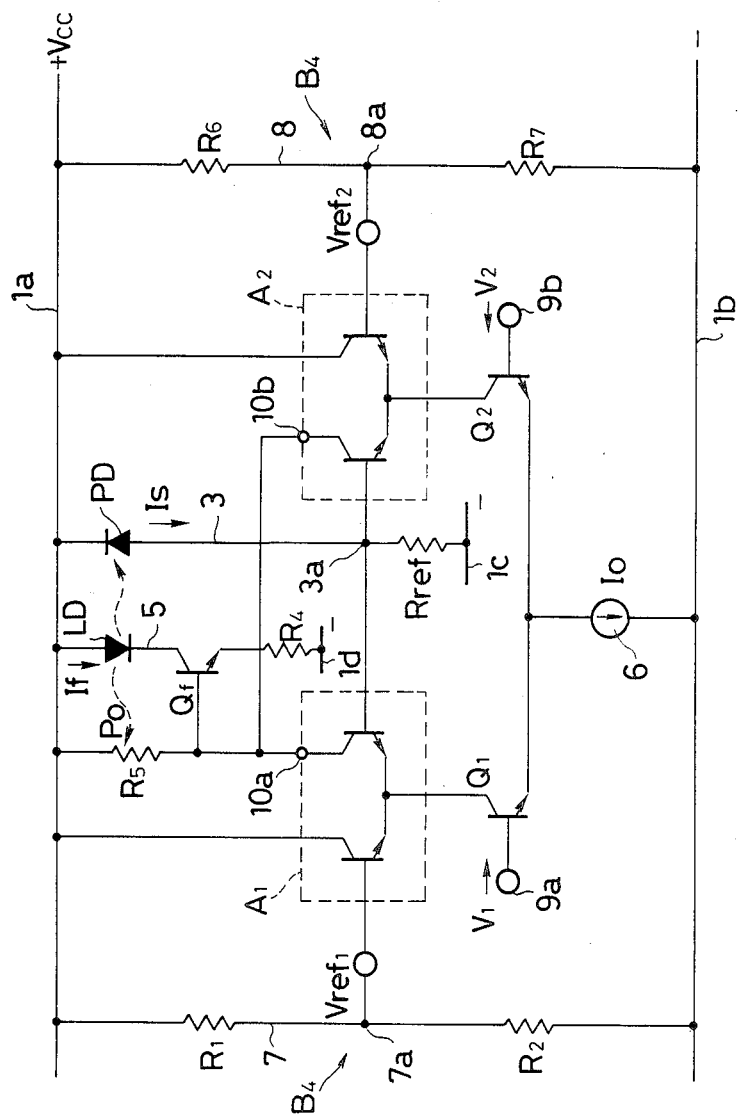
FIG. 11 is a circuit diagram which shows an eighth embodiment of the present invention.

In FIG. 11 is shown an eighth embodiment of the present invention. In the embodiment, reference voltage selection means $B_4$ is constructed by a first voltage dividing circuit 7 formed by connecting two resistors $R_1$ and $R_2$ in series, a second voltage dividing circuit 8 formed by connecting other two resistors $R_6$ and $R_7$, and a transistor pair $Q_1$ and $Q_2$ for switching and selection. In contrast to the direct driving of the laser diode by operational amplifiers that is done in the fifth embodiment (FIG. 7), sixth embodiment (FIG. 9), and seventh embodiment (FIG. 10), in the present embodiment, there is arranged a driving transistor $Q_f$ between the proportional amplifier and the laser diode LD in order to increase the current capacity of the driving current.

Now, a reference voltage $V_{ref1}$ is set at the voltage dividing point 7a of the first voltage dividing circuit 7, and a reference voltage $V_{ref2}$ is set at the voltage dividing point 8a of the second voltage dividing circuit 8. Reference numerals 9a and 9b are the control voltage input terminals for the transistors $Q_1$ and $Q_2$, respectively.

In the embodiment, use are made of two operational amplifiers $A_1$ and $A_2$ whose constant current terminals are connected via transistor elements $Q_1$ and $Q_2$, respectively, to the constant voltage source 6.

It should be mentioned that although the operational amplifiers $A_1$ and $A_2$ are shown in the figure simplified as consisting simply of differential circuits each consisting of a pair of transistors, for the operational amplifiers $A_1$ and $A_2$ of FIG. 11, use are actually made of operational amplifiers $A_1$ and $A_2$ that correspond to those in FIG. 10.

Now, the voltage dividing point 7a of the reference voltage $V_{ref1}$ is connected to the inverting input terminal of the operational amplifier $A_1$, and the voltage dividing point 8a of the reference voltage $V_{ref2}$ is connected to the inverting input terminal of the operational amplifier $A_2$.

On the other hand, the forward current circuit 5 of the laser diode LD is connected to the driving transistor $Q_f$ to increase the driving current of the laser diode LD.

The output terminals 10a and 10b of the operational amplifiers $A_1$ and $A_2$ are connected jointly to the base of the driving transistor $Q_f$. Resistor $R_5$ is a bias setting resistor for the driving transistor $Q_f$. The forward current $I_f$ of the laser diode LD is controlled indirectly by the output voltage of the operational amplifier $A_1$ or $A_2$, via the driving transistor $Q_f$.

To describe the operation of the driving circuit, when a control voltage $V_1$ which satisfies $V_1 > V_2$ is applied to a control voltage input terminal 9a, the transistor $Q_1$ is turned to on-state, and a constant current $I_o$ flows in the operational amplifier $A_1$ to set it in operating condition. Due to the operation of the operational amplifier $A_1$, the driving circuit selects equivalently the reference voltage $V_{ref1}$, the feedback loop between the laser diode LD and the photodiode PD is controlled indirectly via the driving transistor $Q_f$, so as to have the voltage $I_{s1} \cdot R_{ref}$ of the photovoltaic current signal equal to the reference voltage $V_{ref1}$.

When an equilibrium condition is achieved, the photovoltaic current of the photodiode PD becomes $I_{s1}$ which corresponds to the reference voltage $V_{ref1}$, the forward current of the laser diode LD is controlled to $I_{f1}$, and its light output $P_o$ is controlled stably to a constant output level $P_{o1}$ that corresponds to the forward current $I_{f1}$.

Contrary to the above, when a control voltage $V_2$ which satisfies $V_1 < V_2$ is applied to a control votage input terminal 9b, the reference voltage $V_{ref2}$ is selected equivalently by the action of the operational amplifier $A_2$. With an operation similar to the above for what follows, the light output of the laser diode LD is controlled stably to another constant output level $P_o$.

Figure 12:
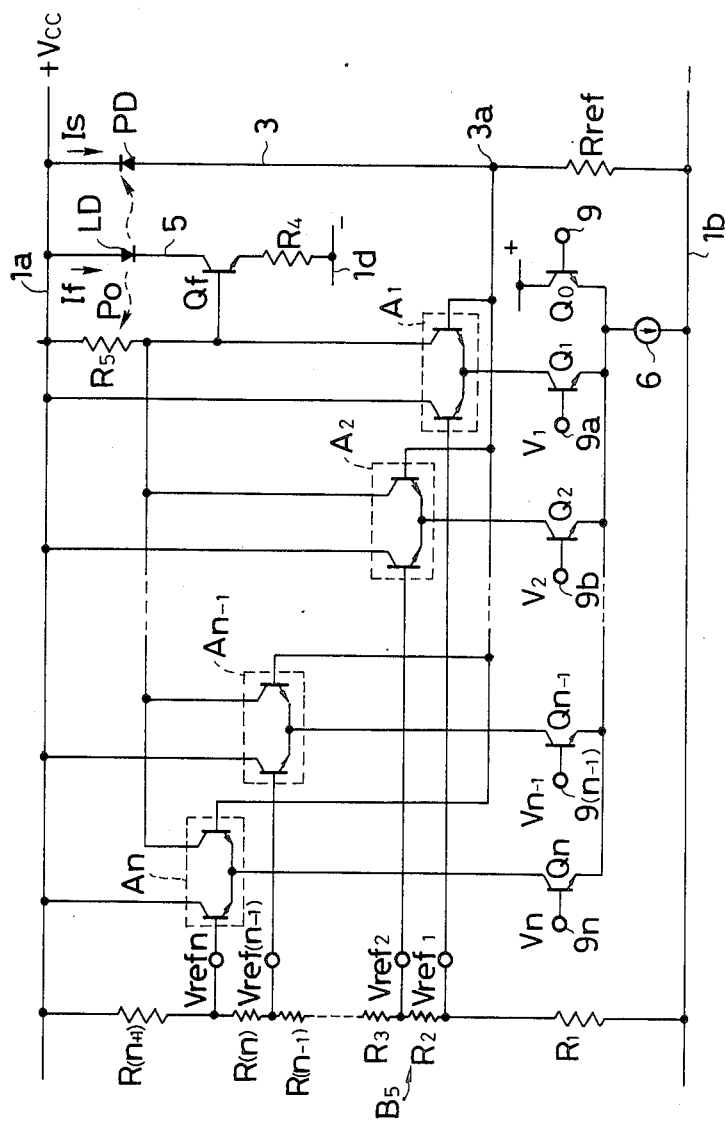
FIG. 12 is a circuit diagram which shows a ninth embodiment of the present invention.

In FIG. 12 is shown a ninth embodiment of the present invention. This embodiment corresponds to an extension of the eighth embodiment.

The reference voltage selection means $B_5$ consists of a voltage dividing circuit formed by connecting (n+1) resistors $R_1$ to $R_{(n+1)}$ in series, and a switching circuit which uses (n+1) differential transistors $Q_0$ to $Q_n$.

Reference numeral 9 is an input terminal of a "threshold voltage" for a logic circuit for reference voltage selection, and 9a to 9n are the input terminals for the control voltages $V_1$ to $V_n$, respectively.

For the reference voltage selection means $B_5$, there are set, similarly to the first embodiment and others, n reference voltages $V_{ref1}$ to $V_{ref(n)}$.

In response to the above, there are provided n operational amplifiers $A_1$ to $A_n$, with each of the reference voltages $V_{ref1}$ to $V_{ref(n)}$ being input to each of the inverting input terminals of the operational amplifiers $A_1$ to $A_n$. Each of the noninverting input terminals of the operational amplifiers $A_1$ to $A_n$ is connected jointly to the output point 3a of the voltage $I_s \cdot R_{ref}$ of the photovoltaic current, and each of the constant current terminals is connected via each of the differential transistors $Q_1$ to $Q_n$ to the common constant current source 6. Each of the output terminals 10a to 10n of the operational amplifiers $A_1$ to $A_n$ is connected jointly to the base of the driving transistor $Q_f$, similarly to the eighth embodiment.

To describe the operation of the switching circuit consisting of the differential transistors $Q_1$ to $Q_n$, only the transistor $Q_{(k)}$ to which is given a control voltage $V_{(k)}$ which is greater than a "threshold voltage" $V_{th}$ is turned on, and the operational amplifier $A_{(k)}$ is set to operating condition. Then, the reference voltage $V_{ref(k)}$ which is input to the operational amplifier $A_{(k)}$ is selected equivalently.

Hereafter, the driving circuit operates substantially similar to the eighth embodiment and the photovoltaic current of the photodiode PD is controlled to the value $I_{s(k)}$ that corresponds to the reference voltage $V_{ref(k)}$. The forward current of the laser diode LD is controlled to $I_{f(k)}$, and its light output $P_o$ is controlled safely to a constant output level $P_{o(k)}$ that corresponds to the forward current $I_{f(k)}$.

As described in the foregoing, according to the present invention, there is provided a reference current selection means which can switch and select a desired value of the reference voltage, and the forward current of the laser diode is controlled by the operational amplifiers so as to bring the voltage of the photovoltaic current signal, that corresponds to the photovoltaic current of the photodiode, equal to a selected reference voltage. Consequently, there can be obtained the effect where the light output of the laser diode can be controlled stably to a plurality of output levels that correspond to each of a plurality of photovoltaic current levels.

What is claimed is:

1. A laser diode driving circuit comprising:
   generating means for monitoring light output from a laser diode and having a photodiode for generating a photovoltaic current that is proportional to the level of the light output;
   a plurality of reference current sources respectively set to separate reference current values;
   current selecting means, disposed corresponding to the plurality of reference current sources, for selecting a required reference current proportional to the level of the light output by switching the plurality of reference current sources; and
   control means for inputting a signal that corresponds to the photovoltaic current and for controlling the forward current of the laser diode so as to set the photovoltaic current to be equal to a selected reference current, said control means having a first input terminal for inputting a signal based on the operation of the photodiode and the current selecting means, a second input terminal having a substantially constant potential, and an output terminal for outputting to the laser diode a signal based on the input signals of the first and second input terminals.

2. The laser diode driving circuit as claimed in claim 1 wherein said control means comprises an operational amplifier, and the output terminal of the operational amplifier is connected to the laser diode.

3. The laser diode driving circuit as claimed in claim 1 wherein said current selecting means has a multipolar switch connected to said control means and the generating means, and the plurality of reference current sources being connected to the multipolar switch.

4. The laser diode driving circuit as claimed in claim 1 wherein said current selecting means has a plurality of switches connected to the control means and the generating means, and the plurality of reference current sources being connected to the multipolar switch.

5. The laser diode driving circuit as claimed in claim 1 wherein said current selecting means has a plurality of differential pairs connected to the control means and the generating means, and a plurality of second transistors connected to the differential pair transistors.

6. The laser diode driving circuit as claimed in claim 1 wherein said current selecting means has a transistor connected to the control means and the generating means, and a second control means connected to the transistor.

7. The laser diode driving circuit as claimed in claim 1 wherein said current selecting means comprises a switch and a constant current source.

8. The laser diode driving circuit as claimed in claim 7 wherein said constant current source comprises a resistor.

9. A laser diode driving circuit as claimed in claim 1, wherein said reference current sources comprise a plurality of resistors, and said current selecting means comprises a rotary switch electrically connected to the photodiode for selecting the required reference current by switching the plurality of resistors.

10. A laser diode driving circuit as claimed in claim 1, wherein said current selecting means comprises a rotary switch electrically connected to the photodiode for selecting the required reference current by switching the plurality of reference current sources.

11. A laser diode driving circuit comprising:
generating means for monitoring light output outputted from a laser diode and having a photodiode for generating a photovoltaic current that is proportional to the level of the light output;
voltage converting means for generating a voltage signal that corresponds to the photovoltaic current;
a plurality of reference voltage sources respectively set to separate reference voltage values;
voltage selecting means, disposed corresponding to the plurality of reference voltage sources, for selecting a required reference voltage proportional to the level of the light output by switching the plurality of separate reference voltage values; and
control means for controlling the forward current of the laser diode so as to bring the voltage signal equal to the selected reference voltage, said control means having a first input terminal for inputting a signal based on the operation of the photodiode and the voltage converting means, a second input terminal having a substantially constant potential selected by the voltage selecting means, and an output terminal for outputting to the laser diode a signal based on the input signals of the first and second input terminals.

12. The laser diode driving circuit as claimed in claim 11 wherein said control means comprises an operational amplifier the output terminal of which is connected to the laser diode.

13. The laser diode driving circuit as claimed in claim 11 wherein said control means comprises an operational amplifier an input terminal of which is connected to the generating means and the voltage connecting means.

14. The laser diode driving circuit as claimed in claim 11 wherein said voltage selecting means has a multipolar switch connected to an input terminal of the control means.

15. The laser diode driving circuit as claimed in claim 11 wherein said voltage selecting means has a plurality of switches connected to an input terminal of the control means.

16. The laser diode driving circuit as claimed in claim 11 wherein said voltage selecting means has a multipolar switch connected to a terminal of the control means, and a current source connected to the multipolar switch.

17. The laser diode driving circuit as claimed in claim 11 wherein the output terminal of the control means is connected to a driving transistor connected to the laser diode.

18. The laser diode driving circuit as claimed in claim 11 wherein said voltage selecting means has transistor pairs connected to a terminal of the control means, and a current source connected to the transistor pairs.

19. The laser diode driving circuit as claimed in claim 17 wherein said control means comprises a transistor pair connected to a power supply and the driving transistor.

20. The laser diode driving circuit as claimed in claim 11 wherein said control means comprises a plurality of operational amplifiers, and the output terminal of each operational amplifier is connected to a driving transistor connected to the laser diode.

21. The laser diode driving circuit as claimed in claim 20 wherein said voltage selecting means has a plurality of differential transistors connected to a constant current terminal of each operational amplifier, and a constant current source connected to each of the differential transistors.

22. The laser diode driving circuit as claimed in claim 20 wherein each of the operational amplifiers comprises paired transistors connected to a power supply and each driving transistor.

23. The laser diode driving circuit as claimed in claim 11 wherein said voltage selecting means has a plurality of switches in parallel to each other.

24. A laser diode driving circuit as claimed in claim 11, wherein said reference voltage sources comprise a plurality of resistors, and said voltage selecting means comprises a rotary switch electrically connectable to the respective resistors for selecting the required reference voltage by switching the resistors.

25. A laser diode driving circuit as claimed in claim 11, wherein said reference voltage sources comprise a plurality of resistors, and said voltage selecting means comprises a plurality of switches electrically connectable to the respective resistors for selecting the required reference voltage by switching the resistors.

26. A laser diode driving circuit as claimed in claim 11, wherein the output terminal of the control means is electrically connected to a driving transistor electrically connected to the laser diode, and said control means further comprises transistor pairs electrically connected to the driving transistor.

27. A laser diode driving circuit comprising:
generating means for monitoring light output from a laser diode and having a photodiode for generating a photovoltaic current that is proportional to the level of the light output;
reference current selecting means for selecting a required reference current proportional to the level of the light output by switching reference current values and changing the required reference current by changing the voltage of the variable voltage source, said reference current selecting means having a variable voltage source and transistor means operated by the operation of the variable voltage source; and control means for inputting a signal that corresponds to the photovoltaic current and controlling the forward current of the laser diode so as to set the photovoltaic current equal to the selected reference current, said control means having a first input terminal for inputting a signal based on the operation of the photodiode and the transistor means, a second input terminal having a substantially constant potential, and an output terminal for outputting to the laser diode a signal based on the input signals of the first and second input terminals.

* * * * *